United States Patent [19]

Cogan

[11] Patent Number: 4,476,622
[45] Date of Patent: Oct. 16, 1984

[54] RECESSED GATE STATIC INDUCTION TRANSISTOR FABRICATION

[75] Inventor: Adrian I. Cogan, Waltham, Mass.

[73] Assignee: GTE Laboratories Inc., Waltham, Mass.

[21] Appl. No.: 573,222

[22] Filed: Jan. 23, 1984

Related U.S. Application Data

[62] Division of Ser. No. 334,404, Dec. 24, 1981.

[51] Int. Cl.³ .......................................... H01L 21/265
[52] U.S. Cl. ........................................ 29/571; 29/578; 29/580; 148/187
[58] Field of Search .................... 29/571, 576 W, 578, 29/580; 148/187

[56] References Cited

U.S. PATENT DOCUMENTS

| | | | |
|---|---|---|---|
| 3,938,241 | 2/1976 | George et al. | 29/571 |
| 3,999,281 | 12/1976 | Goronkin et al. | 29/571 |
| 4,115,793 | 9/1978 | Nishizawa | 357/22 |
| 4,199,771 | 4/1980 | Nishizawa et al. | 357/22 |
| 4,356,041 | 10/1982 | Kosa | 148/187 X |
| 4,375,124 | 3/1983 | Cogan | 29/580 X |

Primary Examiner—G. Ozaki
Attorney, Agent, or Firm—J. Stephen Yeo; Robert E. Walrath

[57] ABSTRACT

A gate-source structure and fabrication method for a static induction transistor having improved gain and frequency characteristics and having relatively simple fabrication requirements. The method and the device are embodied by gate regions diffused into the bottom of parallel recessed grooves located in a high resistivity epitaxial semiconductor layer, the surface of the semiconductor layer having a previously diffused source region located between the recessed grooves. The walls of the recessed grooves are covered with silicon dioxide.

3 Claims, 4 Drawing Figures

RECESSED GATE STATIC INDUCTION TRANSISTOR FABRICATION

This is a division, of application Ser. No. 334,404, filed Dec. 24, 1981.

BACKGROUND OF THE INVENTION

This invention relates to gate-source structures for static induction transistors and, in particular, to a recessed gate structure which improves device performance and which requires relatively simple fabrication techniques.

The static induction transistor is a field effect semiconductor device capable of operation at relatively high frequency and power. The transistors are characterized by a short, high resistivity semiconductor channel which may be controllably depleted of carriers. The current-voltage characteristics of the static induction transistor are generally similar to those of a vacuum tube triode. The devices are described by Nishizawa et al in U.S. Pat. No. 3,828,230 issued Aug. 6, 1974.

The static induction transistor generally uses a vertical geometry with source and drain electrodes placed on opposite sides of a thin, high resistivity layer of one conductivity type. Gate regions of the opposite conductivity type are positioned in the high resistivity layer on opposite sides of the source. During operation a reverse bias is applied between the gate region and the remainder of the high resistivity layer causing a depletion region to extend into the channel below the source. As the magnitude of the reverse bias voltage is varied, the source-drain current and voltage derived from an attached energy source will also vary.

The design and fabrication of the gate-source structure of vertical geometry static induction transistors is difficult. In general, the manufacture of the devices has utilized two basic geometries. One of these geometries calls for placement of the gate junctions on the same surface of the device as source electrodes. The other geometry calls for burying of the gate junctions within the high resistivity semiconductor material between the source and drain electrodes.

The surface-gate geometry facilitates manufacture and results in superior high frequency capability because of its relatively low gate capacitance. However, the surface location of the gate regions adjacent to the source electrode causes inherent difficulty in extending the depletion region under the source and into the channel between the source and drain. In general, the gate regions are of limited depth because of limitations associated with diffusion processes. Because of the limited depth of the gate regions, a relatively large reverse bias voltage must be applied to the gate electrode to deplete the carriers in the channel under the source electrode. Therefore, the surface-gate geometry devices generally have low voltage gain.

The buried-gate structure, on the other hand, is relatively difficult to manufacture but, because of the proximity of the gate regions to the channel, has a high voltage gain. Present buried-gate-structure devices are limited to relatively low frequency operation because of large gate capacitance and resistance.

Previously proposed geometries which combine the low capacitance of the surface-gate structure with the high voltage gain of the buried-gate structure call for extending the gate region below the source and closer to the channel by first etching a relatively deep slot or groove into the surface on each side of the source. The gate region is then formed by one of two methods. One method involves epitaxially refilling each slot or groove to form the gate region. The other method involves diffusion of the gate region into the semiconductor material surrounding each slot or groove.

Both methods require relatively complicated manufacturing processes and neither method fully combines the advantages of the two basic gate structures. While the voltage gain resulting from both methods is high, the resulting gate capacitance is large. A particular problem resulting from use of the diffusion method is the fact that the unprotected vertical side walls of the slot or groove represent a contamination window during device operation.

SUMMARY OF THE INVENTION

The present invention discloses a relatively simple manufacturing method for fabricating the gate-source structure for a high-gain, high-voltage, low-gate-capacitance static induction transistor and discloses the device itself.

The first step of the method disclosed is the etching of relatively deep grooves in an n-type wafer which has, for example, been previously implanted with arsenic and oxidized through a high pressure oxidation cycle. Nitrogen is then implanted into the exposed silicon area at the bottom of the grooves. A short thermal annealing step is used to form protective silicon nitride at the bottom of each groove. An oxidation step follows during which a protective silicon dioxide layer is grown on the vertical walls of the etched grooves. The silicon nitride is then stripped from the bottoms of the grooves and boron is implanted in the bottom of each groove to begin doping to form the gate region. A reactive ion step follows a drive-in cycle. Silicon dioxide is removed from the source region between grooves and metal electrodes are deposited. Due to the shape and depth of the grooves, no mask is necessary to define the gate and source regions during metal deposition.

The fabrication process of the invention is selfaligning and requires no critical masking steps.

The elements of the Figures are not drawn to scale and the Figures are intended only for use in explanation of the fabrication steps and the resulting structure.

DETAILED DESCRIPTION OF THE INVENTION

A wafer, or substrate, of single crystal semiconductor material of one conductivity type is provided as the supporting structure for fabrication of a field effect semiconductor device or static induction transistor according to the present invention. The substrate may be, by way of example, silicon of n-type conductivity having a thickness of 250 to 300 microns and a resistivity of 0.01 ohm centimeters.

Figure 1:
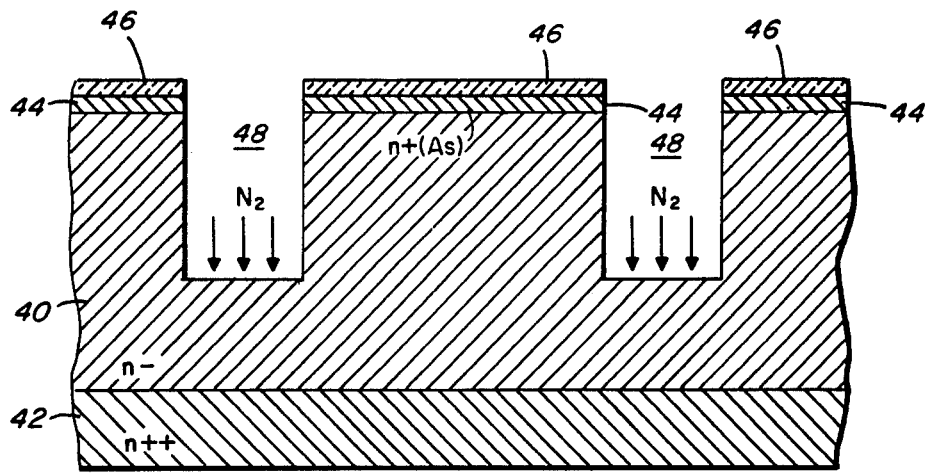
FIG. 1 is a cross-sectional view of a previously processed semiconductor wafer after formation of recessed-gate grooves and after nitrogen implant.

FIG. 1 illustrates a fragment of semiconductor wafer during processing of a static induction transistor according to a preferred embodiment of the present invention. A thin, high resistivity epitaxial layer 40 preferably of (110) orientation n-type conductivity is grown on the upper surface of a highly doped substrate 42 of the same conductivity type. The high resistivity layer may be, for example, 10 to 15 microns in thickness and about 30 ohm-cm resistivity. The wafer is then implanted or doped with arsenic, for example, and oxidized through a high pressure oxidation cycle to form source region or layer 44 and silicon dioxide layer 46. Grooves 48 are etched, using well-known orientation-dependent wet-etching or plasma-assisted etching techniques, in the wafer to a depth of, for example, about 2 to 7 microns. If plasma-assisted etching is used, the preferred crystalline orientation of the wafer is not critical. Grooves 48 may have a width of about 2 to 5 microns. Nitrogen is then implanted into the exposed silicon area at the bottom of the grooves. A short thermal annealing step then causes a protective coating 50 of silicon nitride to form at the bottom of grooves 48. The process is described, for example, by M. Ramin et al in "Oxidation Inhibiting Properties of $Si_3N_4$ Layers Produced by Ion Implantation," Applied Physics 22, 1980 pp. 393–397.

Figure 2:
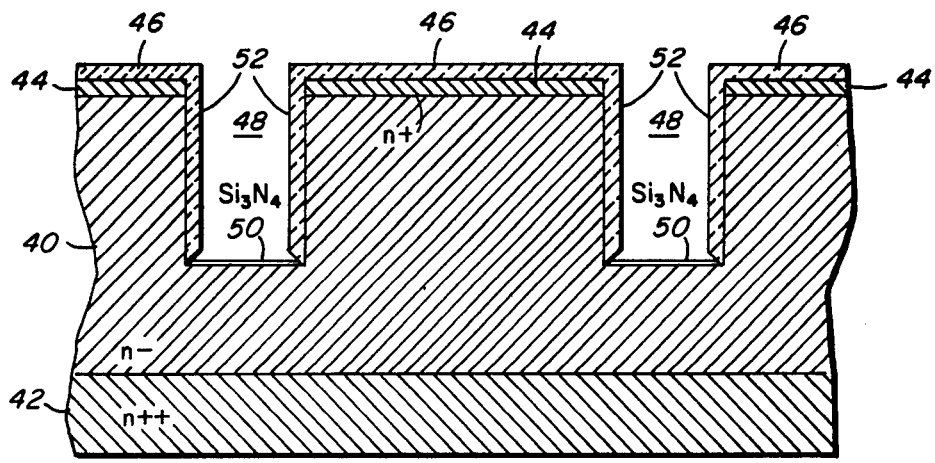
FIG. 2 is a cross-sectional view of the same wafer after a short annealing step and a subsequent oxidation step.

Referring now to FIG. 2, a protective layer 52 of silicon dioxide is grown on the vertically etched walls of grooves 48. As shown by J. A. Apels et al in "Local Oxidation of Silicon," Philips Technical Review 25, 1970, pp. 118–132, silicon nitride coating 50 inhibits growth of silicon dioxide at the bottom of grooves 48.

Figure 3:
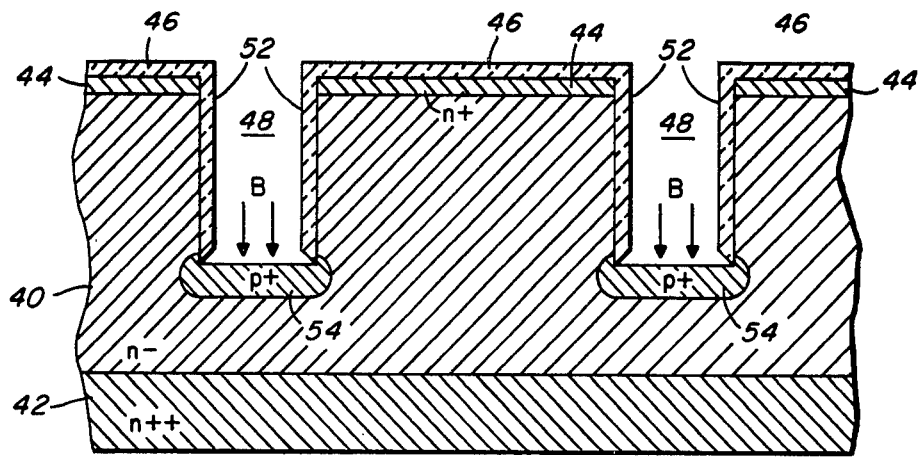
FIG. 3 is a cross-sectional view of the same wafer after silicon nitride has been removed from the bottom of the grooves and boron implanted and driven in to form gate regions.

As illustrated by the structure of FIG. 3, silicon nitride coating 50 is stripped from the bottom of grooves 48. Boron, for example, is then implanted and driven to form gate regions 54 of a depth of, for example, about 1.5 to 3 microns.

Figure 4:
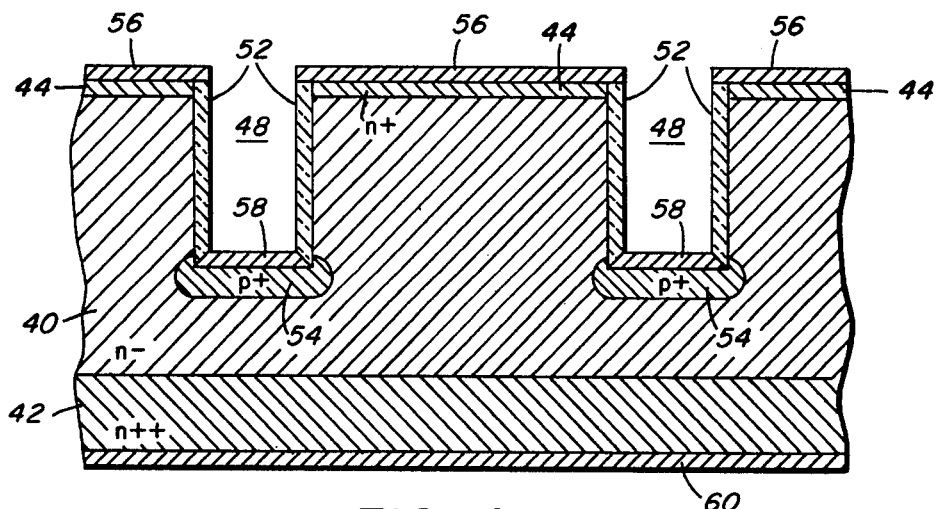
FIG. 4 is a cross-sectional view of the same wafer after metal electrodes have been deposited to form a static induction transistor.

A cross-sectional view of the completed fragment of the static induction transistor is illustrated in FIG. 4. A reactive ion etching step is used to remove silicon dioxide layer 46. Metal electrodes 56 and 58 for the source and gate regions are deposited on the wafer. No masking steps are required because of the step which creates vertical walls of grooves 48. Metal electrode 60 is deposited on the opposite side of substrate 42 to form the drain contact. After processing the individual devices can be separated by any one of a number of conventional techniques.

In the various figures a cross-section of a static induction transistor is shown. Gate regions 46 are formed as strips, for example, 100 to 120 microns in length normal to the plane of the cross-section. Similarly, source region 48 is formed as a strip, for example, about 10 microns shorter than the gate regions 46. The length of the regions is primarily limited by the maximum permitted voltage drop along the electrodes which contact the regions. Additionally, a device with a single source and two gates is shown in FIG. 4. For increased power handling capability additional cells or gate-source combinations can be added as is the normal practice without departing from the scope of the invention.

During operation of the static induction transistor of this invention a time-varying reverse bias voltage is applied by way of the electrodes to the junction between gate region 54 and the remainder of high resistivity layer 40. The associated depletion region extends into high resistivity layer 40 and controls the current flowing between source and drain resulting from an external source of electrical energy, not shown.

What is claimed is:

1. A method for forming a gate-source structure for a static induction transistor, said method comprising the steps of:

growing a high resistivity, epitaxial silicon layer on a semiconductor substrate;

forming a source layer on said high resistivity epitaxial silicon layer;

growing a first silicon dioxide layer over said high resistivity epitaxial silicon layer;

etching through said first silicon dioxide layer and source layer and into said high resistivity epitaxial silicon layer to form recessed grooves, said grooves having a depth of from one-fifth to one-half of the thickness of said high resistivity epitaxial silicon layer;

implanting nitrogen into the exposed silicon area at the bottom of said recessed grooves;

annealing said implanted nitrogen to form a silicon nitride layer in said bottom of said grooves;

growing a second silicon dioxide layer over the vertical walls of said recessed grooves;

stripping said silicon nitride from the bottom of said grooves;

doping the bottom of said grooves;

etching to remove said first silicon dioxide layer; and depositing metal over said structure to form source and gate electrodes.

2. A method as defined in claim 1 wherein said epitaxial layer has a (110) orientation and said first etching step uses a wet-etching technique.

3. A method as defined in claim 1 wherein said epitaxial layer is about ten to fifteen microns thick, said grooves are about two to seve microns deep, and said step of doping the bottom of said grooves forms gate regions about one and one-half to three microns deep from the bottom of said grooves.

* * * * *